United States Patent
Ozawa et al.

(10) Patent No.: US 6,617,626 B2
(45) Date of Patent: Sep. 9, 2003

(54) FERROELECTRIC SEMICONDUCTOR MEMORY DEVICE AND A FABRICATION PROCESS THEREOF

(75) Inventors: Soichiro Ozawa, Kawasaki (JP); Shan Sun, Colorado Springs, CO (US); Hideyuki Noshiro, Kawasaki (JP); George Hickert, Colorado Springs, CO (US); Katsuyoshi Matsuura, Kawasaki (JP); Fan Chu, Black Forest, CO (US); Takeyasu Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/797,430

(22) Filed: Feb. 28, 2001

(65) Prior Publication Data

US 2002/0158278 A1 Oct. 31, 2002

(51) Int. Cl.[7] ............................................... H01L 29/76
(52) U.S. Cl. ........................................ 257/295; 257/296
(58) Field of Search ........................... 257/295, 303, 257/306, 310, 358, 741, 288, 296, 297, 298, 299, 300, 301, 302, 304, 305, 307, 308, 311, 312, 309, 313, 379, 368

(56) References Cited

U.S. PATENT DOCUMENTS 5,708,284 A * 1/1998 Onishi
5,800,683 A * 9/1998 Kammerdiner et al.
5,978,207 A * 11/1999 Anderson et al.
5,982,034 A * 11/1999 Cava et al.
6,265,230 B1 * 7/2001 Aggarwal et al.

FOREIGN PATENT DOCUMENTS

JP           11145385 A       5/1999
JP          2000156473 A      6/2000

OTHER PUBLICATIONS

Kumar et al., "High–Tc Superconductors, Physical Structures, and Role of Constituents," Wiley Encyclopedia of Electrical and Electronics Engineering Online, posted Apr. 28, 2000, John Wiley & Sons, Inc., www.mrw.interscience.wiley.com/eeee/09/1309–3.html.*

* cited by examiner

Primary Examiner—Nathan J. Flynn
Assistant Examiner—Kevin Quinto
(74) Attorney, Agent, or Firm—Hogan & Hartson L.L.P.

(57) ABSTRACT

A ferroelectric random access memory has a ferroelectric capacitor formed of a stacking of a lower electrode, a PZT film and an upper electrode of $SrRuO_3$, wherein the PZT film includes pinholes, with a pinhole density of about $17/\mu m^2$ or less.

6 Claims, 13 Drawing Sheets

FERROELECTRIC SEMICONDUCTOR MEMORY DEVICE AND A FABRICATION PROCESS THEREOF

BACKGROUND OF THE INVENTION

The present invention generally relates to semiconductor devices and more particularly to a semiconductor memory device having a ferroelectric capacitor.

Semiconductor devices such as DRAMs and SRAMs are used extensively in various information processing apparatuses including computers as a high-speed main memory device. These conventional semiconductor devices, however, are volatile in nature and the information stored therein is lost when the electric power is turned off. Thus, it has been practiced in conventional computers and computer systems to use magnetic disk devices as a large capacity, auxiliary storage device for storing programs and data.

However, magnetic disk devices are bulky and fragile, and are inherently vulnerable to mechanical shocks. Further, magnetic disk devices generally have drawbacks of large electrical power consumption and low access speed.

In view of the problems noted above, there is an increasing tendency in computers and computer systems of using flash-memory devices for the non-volatile auxiliary storage device. A flash-memory device is a device having a construction similar to that of a MOS transistor and stores information in an insulated floating gate in the form of electrical charges. It should be noted that flash-memory devices have a construction suitable for monolithic integration on a semiconductor chip in the form of an LSI. Thus, there are attempts to construct a large-capacity storage device comparable to a magnetic disk device by using a flash-memory.

In a flash-memory device, writing of information is achieved by tunneling of hot electrons through a tunneling insulation film into the floating gate electrode. Further, erasing of the information is achieved also by causing the electrons in the floating gate to tunnel to a source region or to a channel region through the tunneling insulation film. Thus, a flash-memory device has an inherent drawback in that it takes a substantial time for writing or erasing information. Further, a flash-memory device generally shows the problem of deterioration of the tunneling insulation film after a repeated writing and erasing operations. When the tunneling insulation film is deteriorated, the reading or erasing operation becomes unstable and unreliable. An EEPROM, having a similar construction to a flash-memory, has a similar problem.

In view of the various drawbacks of the foregoing conventional non-volatile semiconductor devices, there is a proposal of a ferroelectric semiconductor memory device designated hereinafter as FeRAM for the auxiliary memory device and further for the high-speed main memory device of a computer. A ferroelectric semiconductor memory device stores information in a ferroelectric capacitor insulation film in the form of spontaneous polarization.

A ferroelectric semiconductor memory device typically includes a memory cell transistor and a memory cell capacitor similarly to a DRAM, wherein the memory cell capacitor uses a ferroelectric material such as PZT ($Pb(Zr,Ti)O_3$) or PLZT ($(Pb,La)(Zr,Ti)O_3$) for the capacitor insulation film. Thus, the ferroelectric semiconductor memory device is suitable for monolithic integration to form an LSI.

As the ferroelectric semiconductor memory device carries out writing of information by controlling the spontaneous polarization of the ferroelectric capacitor insulation film, the writing operation is achieved with high speed, faster by a factor of 1000 or more than the case of a flash-memory. As noted before, the writing of information is achieved in a flash-memory by injecting hot electrons into the floating gate through the tunneling insulation film. As the control of the polarization is achieved by simply applying a voltage, the power consumption is also reduced below about 1/10 as compared with the case of a flash-memory. Further, the ferroelectric semiconductor memory device, lacking the tunneling insulation film, provides an increased lifetime of one hundred thousand times as large as the lifetime of a flash-memory device.

FIG. 1 shows the construction of a conventional FeRAM 10.

Referring to FIG. 1, the FeRAM 10 includes a memory cell transistor constructed on a Si substrate 11, which may be any of the p-type or n-type. The half of the cell structure is represented in FIG. 1, wherein it should be noted that the process used in FIG. 1 is nothing more than an ordinary CMOS process. Thus, a p-type well 11A is formed on a Si substrate 11, on which an active region is defined by a field oxide film 12. On the Si substrate 11, there is provided a gate electrode 13 in correspondence to the foregoing active region, wherein the gate electrode 13 constitutes the word line of the FeRAM. Further, a gate oxide film not illustrated is interposed between the Si substrate 11 and the gate electrode 13, and diffusion regions 11B and 11C of the $n^+$-type are formed in the p-type well 11A at both lateral sides of the gate electrode 13 as the source region and the drain region of the memory cell transistor. Thereby, a channel region is formed in the p-type well 11A between the diffusion region 11B and the diffusion region 11C.

It should be noted that the gate electrode 13 is covered by a CVD oxide film 14 provided so as to cover the surface of the Si substrate 11 in correspondence to the active region. A lower electrode 15 having a Pt/Ti structure is deposited on the CVD oxide film 14, wherein the lower electrode 15 constitutes the drive line of the FeRAM. A ferroelectric capacitor insulation film 16 of PZT or PLZT covers the lower electrode 15, and an upper electrode 17 of Pt is formed on the ferroelectric capacitor insulation film 16.

It should be noted that the lower electrode 15, the ferroelectric capacitor insulation film 16 and the upper electrode 17 form together a ferroelectric capacitor. The ferroelectric capacitor as a whole is covered by another interlayer insulation film 18.

The contact hole 18A is formed in the interlayer insulation film 18 so as to expose the upper electrode pattern 17, and contact holes 18B and 18C are formed further in the interlayer insulation film 18 and 14 so as to expose the diffusion regions 11B and 11C, respectively.

The local interconnection pattern 19A is formed by an Al-alloy such that the local interconnection pattern 19A connects the contact hole 18A and the contact hole 18B electrically.

There is provided a bit line pattern 19B of an Al-alloy on the interlayer insulation film 18 so as to make an electrical contact with the diffusion region 11C at the contact hole 18C. The local interconnection pattern 19A and the bit line 19B are covered by a passivation film 20.

In such an FeRAM, it is important to maximize the switching electric charge of the ferroelectric capacitor insulation film 16 and minimize the leakage current. Further, it is necessary that the ferroelectric capacitor insulation film 16 maintains the initial switching electric charge over a long period of time.

In order to maximize the switching electric charge, it is practiced conventionally to deposit the ferroelectric capacitor insulation film 16 by a sputtering process in the form of an amorphous phase and apply a crystallization process in an $O_2$ atmosphere.

In order to maintain the large switching electric charge for the ferroelectric capacitor insulation film 16, it is further desired to form the upper electrode 17 in an oxidizing atmosphere so as to avoid formation of oxygen defect in the ferroelectric capacitor insulation film. Thus, there is a proposal to use a conductive oxide such as $IrO_2$ for the upper electrode 17 in place of Pt.

It turned out, however, that a ferroelectric capacitor having the ferroelectric capacitor insulation film 16 of PZT in combination with the upper electrode of $IrO_2$ raises a problem of aging of the PZT film 16 in that the value of the switching electric charge decreases with time. In order to avoid this aging problem, it has been necessary to dope the PZT film 16 with Ca and Sr with a substantial amount, while such a doping of the PZT film 16 invites a decrease in the value of the switching electric charge.

In view of the foregoing, investigations have been made on an FeRAM in which a ferroelectric capacitor insulation film of a sputtered PZT film is combined with an upper electrode of $SrRuO_3$. It turned out, however, that the ferroelectric capacitor of the foregoing construction, while being able to suppress the aging, suffers from the problem of large leakage current. With regard to the degradation of the leakage characteristic of a PZT film combined with an upper electrode of $IrO_2$ or $SrRuO_3$, reference should be made to Stolichnov, I., et al., "ELECTRICAL TRANSPORT PROPERTIES OF Pb(Zr,Ti)O3/OXIDE ELECTRODE INTERFACE, $9^{th}$ European Meeting on Ferroelectricity, Praha, Czech Republic, Jul. 12, 1999.

SUMMARY OF THE INVENTION

Accordingly, it is a general object of the present invention to provide a novel and ferroelectric random access memory wherein the foregoing problems are eliminated.

Another and more specific object of the present invention is to provide a ferroelectric random access memory having a reduced leakage current for a ferroelectric capacitor used therein.

Another object of the present invention is to provide a ferroelectric random access memory, comprising:

a substrate carrying thereon an active device;

a lower electrode provided over said substrate in electrical connection with said active layer;

a ferroelectric film containing at least Pb, Zr and Ti and having a perovskite structure, said ferroelectric film comprising a number of crystal grains extending continuously from a bottom surface to a top surface of said ferroelectric film and forming a columnar microstructure, said crystal grains having pinholes of a size of several ten nanometers; and an upper electrode of a conductive oxide film provided on said ferroelectric film, said upper electrode having a perovskite structure and containing therein Sr and Ru, said ferroelectric film further containing Ca and Sr, said ferroelectric film including said pinholes with a density not exceeding $34/\mu m^2$.

Another object of the present invention is to provide a method of fabricating a ferroelectric random access memory comprising the steps of:

depositing a ferroelectric film having a perovskite structure on a lower electrode by a sputtering process that uses a target containing therein at least Pb, Zr, Ti, Ca and Sr;

annealing said ferroelectric film in a first, inert atmosphere that contains $O_2$ with a reduced partial pressure;

annealing said ferroelectric film, after said step of annealing in said first atmosphere, in a second, oxidizing atmosphere;

depositing, after said step of annealing in said second atmosphere, a conductive film having a perovskite structure and containing therein Sr and Ru on said ferroelectric film, said target containing Ca and Sr with respective concentrations, normalized to a sum of Zr and Ti atoms in said target, such that said concentration of Ca does not exceed 0.035 and such that said concentration of Sr does not exceed 0.025.

According to the present invention, the leakage current flowing through the ferroelectric film is minimized by controlling the pinhole density in the ferroelectric film to be less than $34/\mu m^2$, preferably about $17/\mu m^2$, or less. In view of the fact that such a decrease of the pinhole density is achieved by decreasing the content of Ca and Sr in the ferroelectric film, the ferroelectric capacitor of the present invention can provide a large value for the switching electric charge. In the present invention, the problem of aging of the ferroelectric film is successfully avoided even when the Ca and Sr contents are reduced in the ferroelectric film due to the fact that both the ferroelectric film and the upper electrode have the perovskite structure and that the degree of lattice misfit between the ferroelectric film and the upper electrode is reduced as compared with the case of using $IrO_2$ for the upper electrode.

Another object of the present invention is to provide a method of fabricating a ferroelectric random access memory, comprising the steps of:

depositing a ferroelectric film containing Pb, Zr and Ti on a lower electrode by a sputtering process;

annealing said ferroelectric film in a first, inert atmosphere that contains $O_2$ with a reduced partial pressure;

depositing an upper electrode of a conductive film having a perovskite structure and containing Sr and Ru therein on said ferroelectric film; and annealing said ferroelectric film and said upper electrode in a second, oxidizing atmosphere.

According to the present invention, the upper electrode is formed on the ferroelectric film prior to the annealing process conducted in the oxidizing atmosphere and hence prior to the formation of pinholes in the ferroelectric film. Further, the formation of pinholes in the ferroelectric film is suppressed as a result of conducting the second annealing process while mechanically holding the top surface of the ferroelectric film by the upper electrode. The ferroelectric film thus processed has a characteristic flat and smooth top surface.

Other objects and further features of the present invention will become apparent from the following detailed description when read in conjunction with the attached drawings.

DETAILED DESCRIPTION OF THE INVENTION

[Principle]

Figure 1:
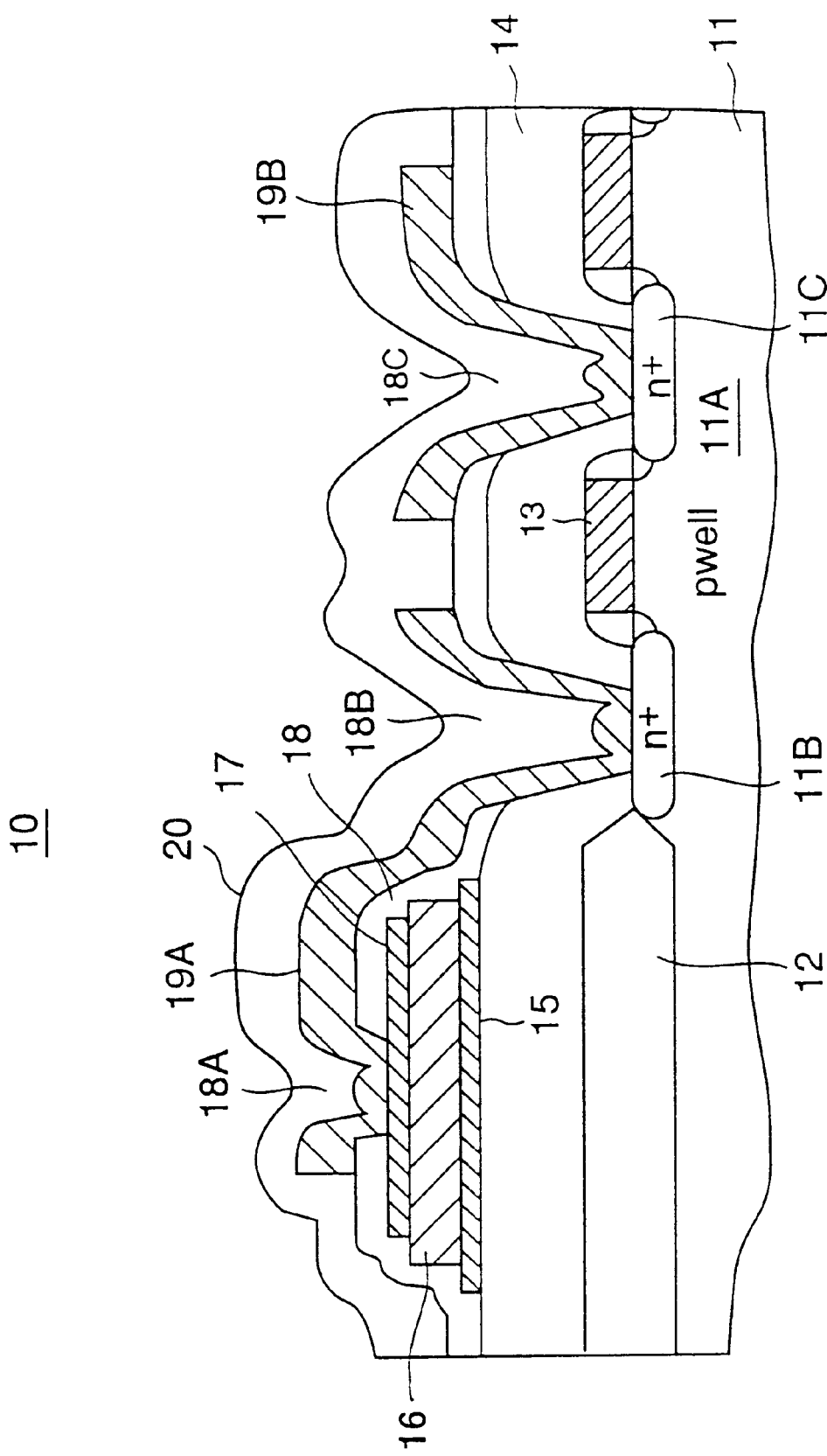
FIG. 1 is a diagram showing the construction of a conventional FeRAM.
Figure 2:
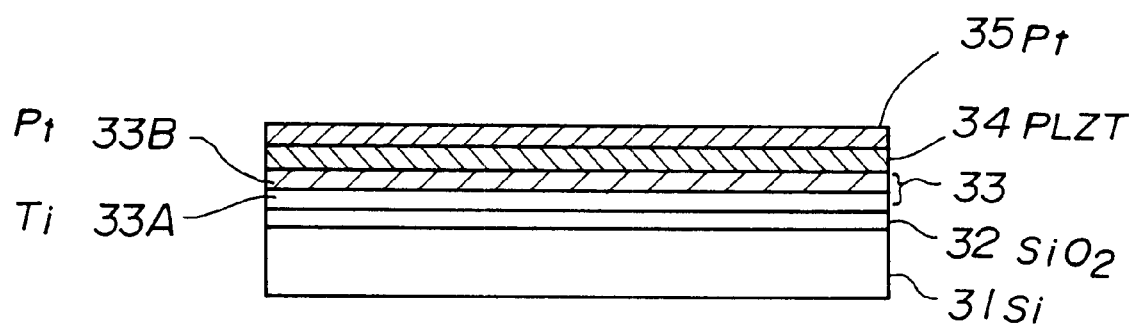
FIG. 2 is a cross-sectional diagram of a ferroelectric capacitor for explaining the principle of the present invention.

The inventor of the present investigation has conducted an investigation with regard to leakage characteristic on various ferroelectric capacitors having a structure represented in FIG. 2.

Referring to FIG. 2, a ferroelectric capacitor 30 is constructed on a Si substrate 31 covered by an oxide film 32, wherein a lower electrode 33, comprising of a stacking of a Ti layer 33A and a Pt layer 33B, is formed on the oxide film 32 by consecutively depositing the Ti layer 33A and the Pt layer 33B by a sputtering process with respective thicknesses of 20 nm and 175 nm.

On the lower electrode 33 thus formed, a PZT film 34 is formed with a thickness of about 200 nm by a sputtering process under various conditions, wherein the PZT film 34 thus formed is subjected to a first annealing process conducted in an Ar atmosphere containing $O_2$ with a proportion not exceeding 5% at 600° C. for a very short duration of 90 seconds, followed by a second annealing process conducted in an $O_2$ atmosphere at 725° C. for a duration of 20 seconds. As a result of the first annealing process a densification occurs in the lower electrode 33 and the migration of Ti from the Ti layer 33A to the surface of the Pt layer 33B is minimized. Further, there occurs crystallization in the PZT film 34 and the PZT film 34, which has been deposited initially in the form of an amorphous phase, acquires ferroelectricity. As a result of the second annealing process, on the other hand, the PZT film 34 undergoes a further densification and oxygen defects therein are compensated. As a result, the ferroelectricity of the PZT film 34 is enhanced further. It should be noted that the PZT film 34 thus subjected to the first and second annealing processes have pinholes as a result of densification of the film.

Next, an upper electrode 35 of Pt, $IrO_2$ or $SrRuO_3$ is formed on the PZT film 34 by a sputtering process, wherein the upper electrode 35 thus formed is subjected to a further thermal annealing process for crystallization in the case the upper electrode 35 is formed of $IrO_2$ or $SrRuO_3$. It should be noted that the crystallization of the $IrO_2$ or $SrRuO_3$ upper electrode 35 is conducted in an oxidizing atmosphere at the temperature of 725° C.

TABLES I–IV below show the leakage current observed for the capacitor of FIG. 2 for the case the upper electrodes 35 is changed variously, wherein TABLE I represents the case in which a conventional PZT target Std containing Ca and Sr with respective concentrations, normalized with respect to a sum of Zr and Ti atoms therein (Ca=Ca/(Zr+Ti), Sr=Sr/(Zr+Ti)) of 0.05 and 0.025 is used during the sputtering process of the PZT film 34, while TABLE II represents the case in which a PZT target 2C55 containing Ca and Sr with respective concentrations, normalized with respect to a sum of Zr and Ti atoms therein, of 0.035 and 0.025 is used during the sputtering process of the PZT film 34. Further, TABLE III represents the case in which a PZT target 1C58 containing Ca and Sr with respective concentrations, normalized with respect to a sum of Zr and Ti atoms therein, of 0.02 and 0.01 is used during the sputtering process of the PZT film 34.

TABLE I

| PZT depo-process | sputter | sputter | sputter |
|---|---|---|---|
| pinholes in PZT | $34/\mu m^2$ | $34/\mu m^2$ | $34/\mu m^2$ |
| upper electrode | Pt | $IrI_2$ | $SrRuO_3$ |
| leakage current | $<1 \times 10^{-5}$ A/cm$^2$ | $1 \times 10^{-5}$ A/cm$^2$ | $1 \times 10^{-2}$ A/cm$^2$ |

Ca/(Zr + Ti) in target = 0.05
Sr/(Zr + Ti) in target = 0.025
Target = Std

TABLE II

| PZT depo-process | sputter | sputter | sputter |
|---|---|---|---|
| pinholes in PZT | $34/\mu m^2$ | $34/\mu m^2$ | $34/\mu m^2$ |
| upper electrode | Pt | $IrI_2$ | $SrRuO_3$ |
| leakage current | $<1 \times 10^{-5}$ A/cm$^2$ | $1 \times 10^{-5}$ A/cm$^2$ | $1 \times 10^{-2}$ A/cm$^2$ |

Ca/(Zr + Ti) in target = 0.035
Sr/(Zr + Ti) in target = 0.025
Target = 2CS5

TABLE III

| PZT depo-process | sputter | sputter | sputter |
|---|---|---|---|
| pinholes in PZT | $17/\mu m^2$ | $17/\mu m^2$ | $17/\mu m^2$ |
| upper electrode | Pt | $IrO_2$ | $SrRuO_3$ |
| leakage current | $<1 \times 10^{-5}$ A/cm$^2$ | $1 \times 10^{-5}$ A/cm$^2$ | $1 \times 10^{-5}$ A/cm$^2$ |

Ca/(Zr + Ti) in target = 0.02
Sr/(Zr + Ti) in target = 0.01
Target = 1CS8

TABLE IV

| PZT depo-process | sputter | sputter | sputter |
|---|---|---|---|
| pinholes in PZT | $<1/\mu m^2$ | $<1/\mu m^2$ | $<1/\mu m^2$ |
| upper electrode | Pt | 1r02 | SrRuO3 |
| leakage current | $<1 \times 10^{-5}$ A/cm$^2$ | $1 \times 10^{-5}$ A/cm$^2$ | $1 \times 10^{-5}$ A/cm$^2$ |

Ca/(Zr + Ti) in target = 0
Sr/(Zr + Ti) in target = 0
Target = QL

Referring to TABLES I–IV, it can be seen that the pinhole density in the PZT film 34 decreases with decreasing Ca and Sr content in the sputtering target and hence the Ca and Sr content in the PZT film 34, provided that the upper electrode 35 of $SrRuO_3$ is formed on the PZT film 34. Further, it is noted that the leakage current is not influenced by the pinhole density in the case the upper electrode 35 is formed of Pt or $IrO_2$.

In the case the upper electrode 35 is formed of $SrRuO_3$, it can be seen that a large leakage current of $10^{-2}$ A/cm$^2$ is observed when the PZT target contains Ca and Sr with the concentration levels, in terms of the foregoing normalized concentrations levels with respect to the Zr and Ti atoms, of 0.05 and 0.025 as represented in TABLE I or 0.035 and 0.025 as represented in TABLE II. Further, it can be seen that the leakage current is decreased to the level of $1\times10^{-5}$ A/cm$^2$ when the target containing Ca and Sr with the normalized concentration levels of 0.02 and 0.01 or less is used as represented in TABLE III or TABLE IV.

In view of the fact that the PZT film 34 formed under the condition of TABLE I or TABLE II has the pinhole density of about $34/\mu m^2$ and that the PZT film 34 formed under the condition of TABLE III or IV contains Ca and Sr have the pinhole density of $17/\mu m^2$ or less, it is believed that the pinholes in the PZT film 34 somehow function as the leakage path in the case the upper electrode 35 is formed of a conductive perovskite containing Sr and Ru.

In the case the upper electrode 35 is formed of Pt or $IrO_2$, no such dependence of the leakage characteristic can be seen. This observation indicates that the mechanism of leakage current is different between the case in which $IrO_2$ or Pt is used for the upper electrode 35 and the case in which $SrRuO_3$ is used for the upper electrode 35.

Figure 3A:
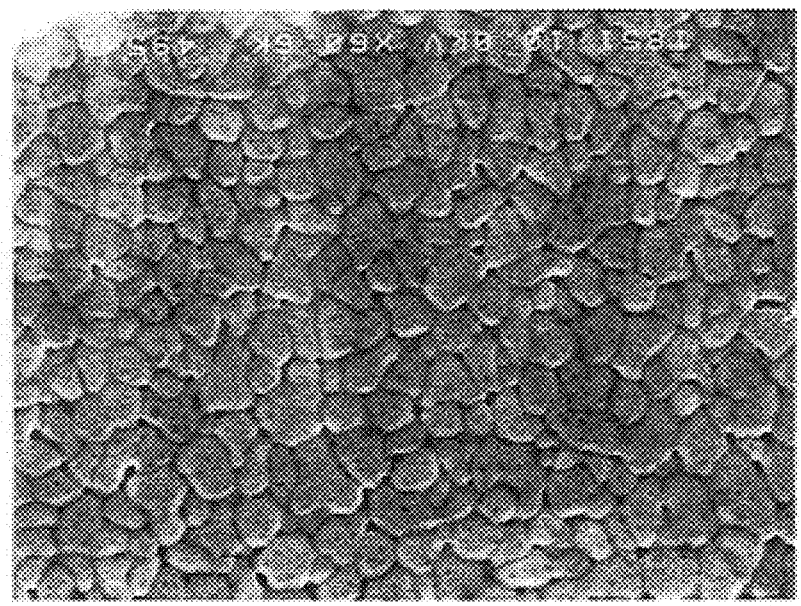
FIGS. 3A–3D are diagrams showing the surface microstructure of various PZT films formed by using various sputter targets.

FIG. 3A shows the surface microstructure of the PZT film 34 corresponding to TABLE II observed by a scanning electron microscope in the state prior to the deposition of the upper electrode 35.

Referring to FIG. 3A, it can be seen that the PZT film 34, formed by the sputtering process that uses the PZT target 2CS5 of TABLE II, has a granular texture when viewed from a top direction in that the film 34 is formed of crystal grains each having a generally uniform size of several ten nanometers, wherein each of the crystal grains extends generally perpendicularly to the principal surface of the PZT film 34 up to the bottom interface to the lower electrode 33.

Figure 4:
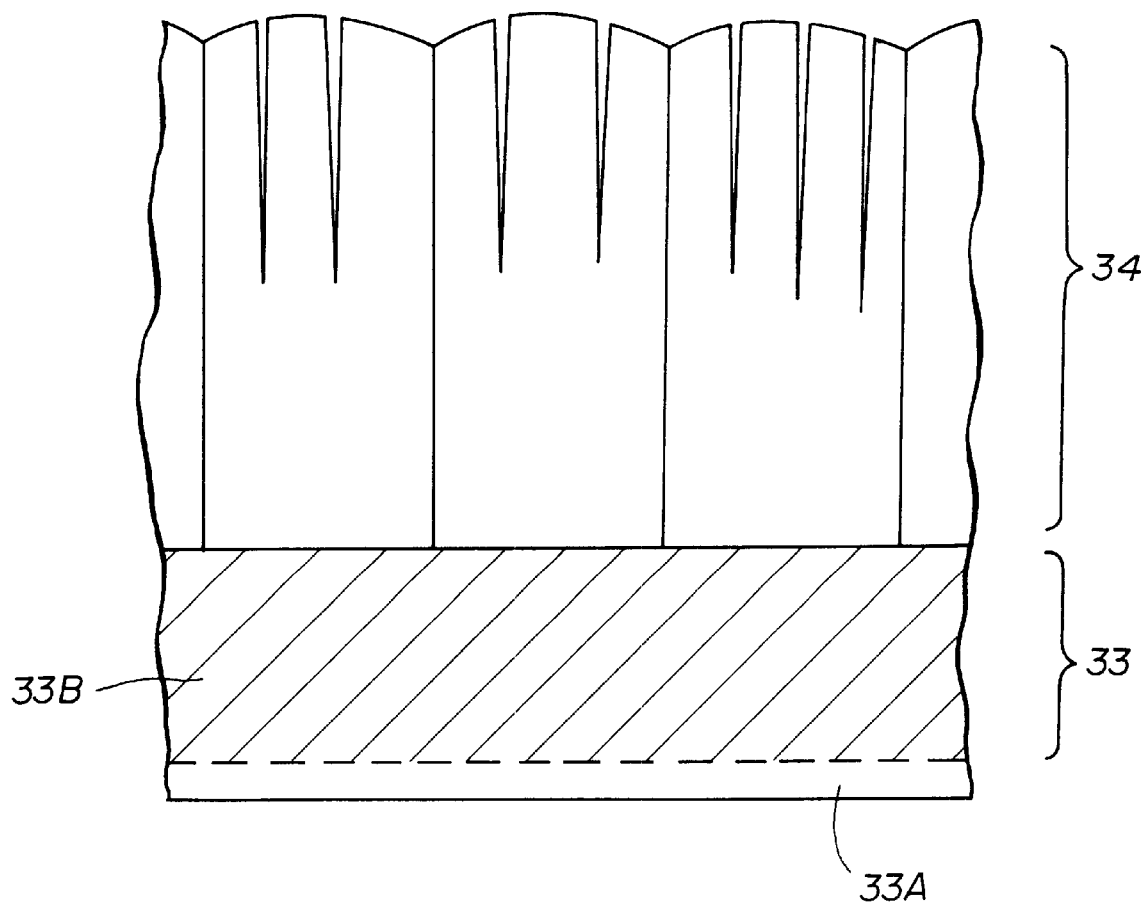
FIG. 4 is a schematic cross-sectional diagram of the PZT film of FIGS. 3A–3D.

Further, it can be seen that each of the crystal grains includes a number of pinholes having a size of, judging from the resolution of the scanning electron microscope, several nanometers, wherein each of the pinholes extends generally perpendicularly to the principal surface of the PZT film 34 as represented in FIG. 4. It should be noted that the pinholes appear as a result of the second thermal annealing process conducted in the oxidizing atmosphere and are formed as a result of densification of the PZT film 34.

Figure 3B:
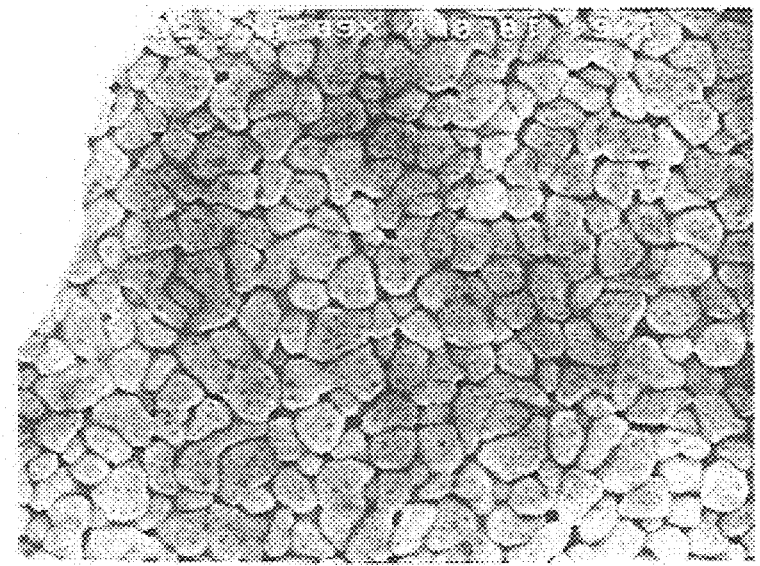

In the PZT film 34 of FIG. 3A, it is noted that the average surface density of the pinholes is about $34/\mu m^2$, wherein this value of the pinhole density is obtained also in the case of FIG. 3B in which the PZT film 34 is formed by a sputtering process while using the conventional PZT target Std represented in TABLE I.

Figure 3C:
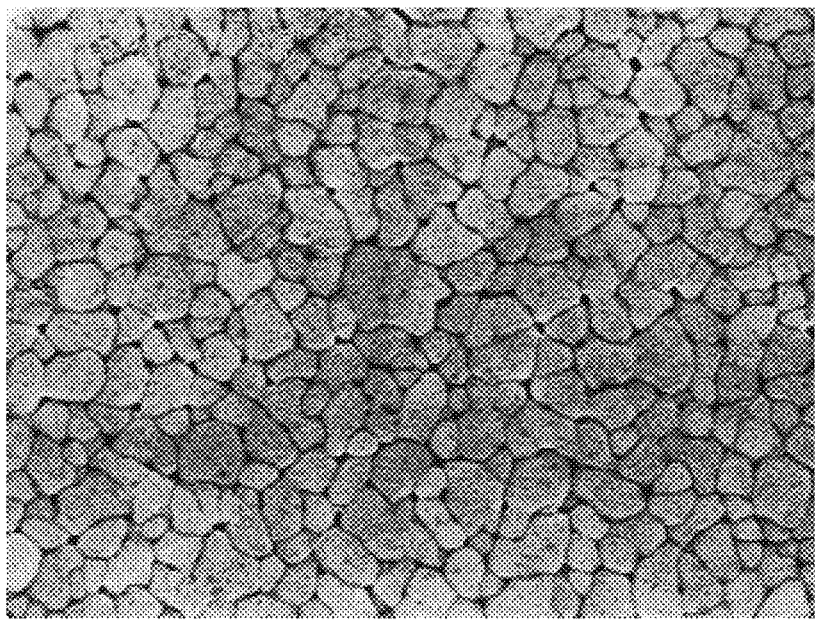

FIG. 3C shows the surface microstructure of the PZT film 34 corresponding to TABLE III observed by a scanning electron microscope in the state prior to the deposition of the upper electrode 35.

Referring to FIG. 3C, it can be seen that the PZT film 34 has a granular texture similar to that of FIG. 3A on the surface thereof in that the film 34 is formed of crystal grains each having a generally uniform size of several ten nanometers. In the texture of FIG. 3C, on the other hand, the pinhole density is reduced to $17/\mu m^2$.

Figure 3D:
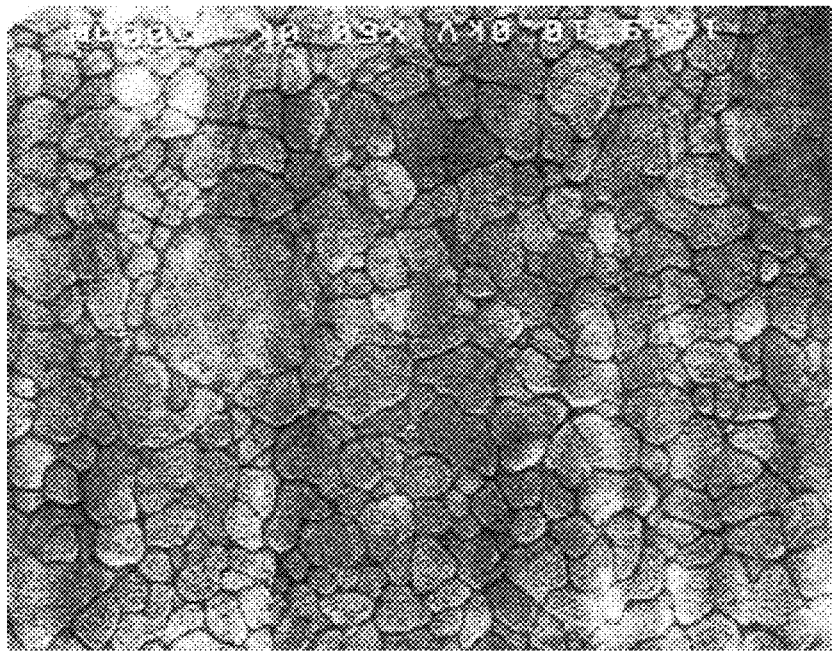

FIG. 3D shows the surface microstructure of the PZT film 34 corresponding to TABLE IV observed by a scanning electron microscope in the state prior to the deposition of the upper electrode 35.

Referring to FIG. 3D, it can be seen that the PZT film 34 has a granular texture similar to that of FIG. 3A on the surface thereof in that the film 34 is formed of crystal grains each having a generally uniform size of several ten nanometers. In the texture of FIG. 3D, on the other hand, the pinhole density is reduced to less than $1/\mu m^2$.

Thus, from the observation of FIGS. 3A–3D, it is noted that the pinhole density of the PZT film 34, and hence the leakage current flowing through the PZT film 34 along the pinholes in the event the upper electrode 35 of $SrRuO_3$ is provided on the PZT film 34, are reduced effectively when the PZT film 34 is formed under the condition of TABLE III or TABLE IV.

TABLE V–TABLE VII below represent the leakage characteristic of the ferroelectric capacitor 30 of FIG. 2 in the event the PZT film 34 is formed by a sol-gel process. Similarly as before, each of TABLES V–VII represents the leakage current for the case in which the upper electrode 35 is formed of Pt, $IrO_2$ and $SrRuO_3$, wherein TABLE V represents the case in which the PZT film 34 contains pinholes with a density of $34/\mu m^2$, while TABLE VI represents the case in which the PZT film 34 contains pinholes with a density of $17/\mu m^2$. Further, TABLE VII represents the case in which the PZT film 34 contains pinholes with a density of less than about $1/\mu m^2$.

TABLE V

| PZT depo-process | sol-gel | sol-gel | sol-gel |
| --- | --- | --- | --- |
| pinholes in PZT | $34/\mu m^2$ | $34/\mu m^2$ | $34/\mu m^2$ |
| upper electrode | Pt | $IrO_2$ | $SrRuO_3$ |
| leakage current | $<1 \times 10^{-5}$ A/cm$^2$ | $1 \times 10^{-5}$ A/cm$^2$ | $1 \times 10^{-5}$ A/cm$^2$ |

TABLE VI

| PZT depo-process | sol-gel | sol-gel | sol-gel |
| --- | --- | --- | --- |
| pinholes in PZT | $17/\mu m^2$ | $17/\mu m^2$ | $17/\mu m^2$ |
| upper electrode | Pt | $IrO_2$ | $SrRuO_3$ |
| leakage current | $<1 \times 10^{-5}$ A/cm$^2$ | $1 \times 10^{-5}$ A/cm$^2$ | $1 \times 10^{-5}$ A/cm$^2$ |

TABLE VII

| PZT depo-process | sputter | sputter | sputter |
| --- | --- | --- | --- |
| pinholes in PZT | $<1/\mu m^2$ | $<1/\mu m^2$ | $<1/\mu m^2$ |
| upper electrode | Pt | $IrO_2$ | $SrRuO_3$ |
| leakage current | $<1 \times 10^{-5}$ A/cm$^2$ | $1 \times 10^{-5}$ A/cm$^2$ | $1 \times 10^{-5}$ A/cm$^2$ |

As can be seen from TABLES V–VII, the pinhole density in the PZT film 34 does not influence the leakage current even in the case a $SrRuO_3$ film is provided on the PZT film 34 as the upper electrode 35, provided that the PZT film 34 is formed by a sol-gel process. Thus, it is concluded that the foregoing dependence of the leakage current in the PZT film 34 on the pinhole density in the PZT film 34 is a phenomenon appearing peculiarly when the PZT film 34 is formed by a sputtering process and at the same time the upper electrode 35 is formed of $SrRuO_3$.

From the results of TABLES I–IV, it is further concluded that, in order to minimize the leakage current of the ferroelectric capacitor 30 having the sputtered PZT capacitor insulation film 34 in combination with the $SrRuO_3$ upper electrode 35, it is desirable to use a PZT sputter target containing Ca and Sr with the normalized concentration levels of less than 0.035 and 0.025 respectively so that the sputtered PZT film 34 has a pinhole density of less than $34/\mu m^2$ after the crystallization process by the second thermal annealing process conducted in the $O_2$ atmosphere. It is more preferable to use a PZT sputter target containing Ca and Sr with the normalized concentration levels of about 0.02 and 0.01 respectively, such that the sputtered PZT film 34 has a pinhole density of about $17/\mu m^2$ or less after the crystallization process.

While there is a tendency that the aging of the sputtered PZT film 34 becomes conspicuous when the Ca and Sr content therein are reduced, there arises no serious problem of aging even when the normalized Ca and Sr concentration levels are reduced to about 0.02 and 0.01 as long as the PZT film 34 is covered by the SrRuO₃ upper electrode 35, which has a perovskite structure similarly to the PZT film 34.

Figure 5A:
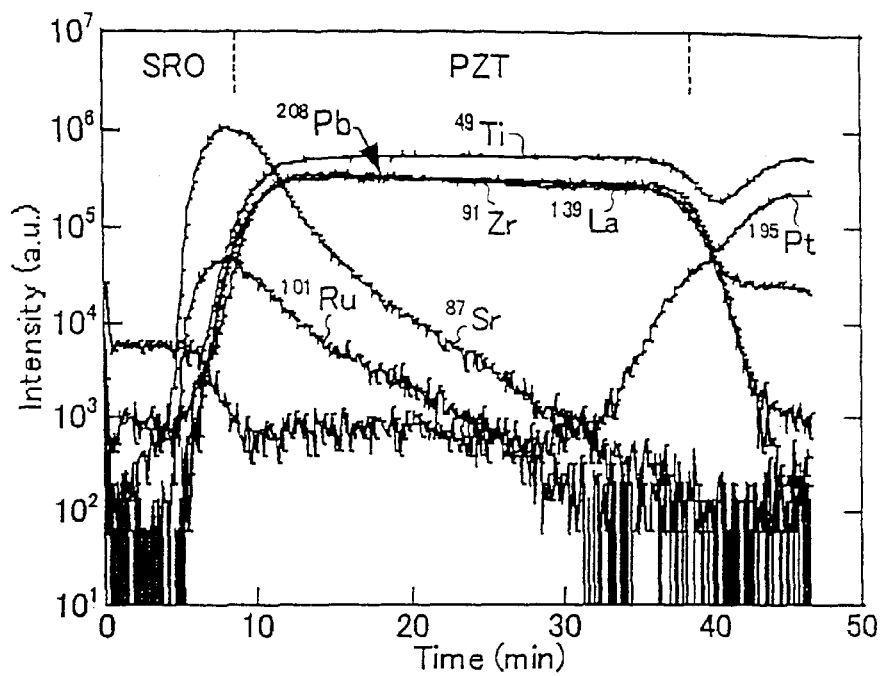
FIGS. 5A and 5B are SIMS profiles of the ferroelectric capacitor of FIG. 2.

FIG. 5A shows the SIMS profile of various elements in the ferroelectric capacitor 30 of FIG. 2 for the case in which the PZT film 34 is formed by using the sputtering target of TABLE I in combination with the upper electrode 35 of SrRuO₃ (SRO). As represented in TABLE I, the ferroelectric capacitor 30 formed as such shows a large leakage current of $1\times10^{-2}$ A/cm².

Referring to FIG. 5A, it can be seen that there occurs an extensive diffusion of Sr and Ru into the PZT film 34 from the upper electrode 35, wherein it is believed that such extensive diffusion of Sr and Ru represented in FIG. 5A occurs along the pinholes formed in the PZT film 34 as schematically represented in FIG. 4. In other words, the result of FIG. 5A supports the hypothesis that the pinholes in the PZT film 34 serves for the diffusion path of Sr and Ru into the PZT film 34 from the upper electrode 35.

As represented in FIG. 4, the projections and depressions that can be seen on the surface of the PZT film 34 in the SEM images of FIGS. 3A–3D correspond to the columnar crystal grains of PZT grown in the PZT film 34 as a result of the crystallization of the PZT film 34.

Figure 5B:
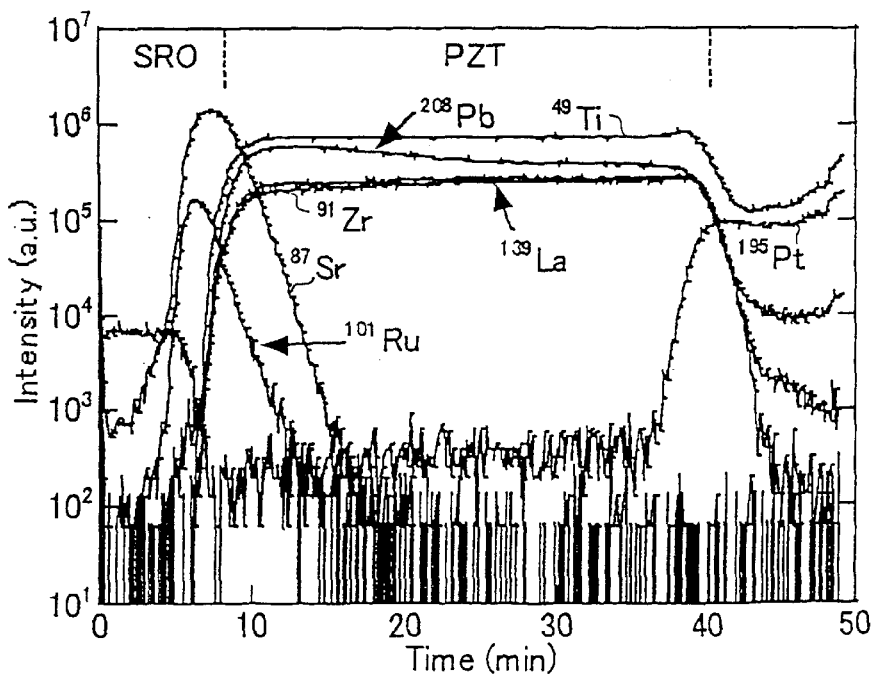

FIG. 5B, on the other hand, represents the SIMS profile for the case in which the PZT film 34 formed according to the condition of TABLE III is combined with the upper electrode 35 of SrRuO₃.

Referring to FIG. 5B, it can be seen that the penetration of Sr and Ru into the PZT film 34 is suppressed substantially. It is believed that this remarkable decrease of the Sr and Ru diffusion is caused as a result of the decrease of the pinhole density to the level of about $17/\mu m^2$ or less.

In the experiments of TABLES I–III, the PZT target contained Zr and Ti atoms with a proportion of 4:6. In the experiment of TABLE IV, on the other hand, the PZT target contained Zr and Ti atoms with the ratio of 3:7.

Thus, in order to investigate the effect of the Zr/Ti ratio in the PZT target, the inventor of the present invention has deposited the PZT film 34 in the ferroelectric capacitor 30 of FIG. 2 by using a PZT target similar to the one used conventionally except that the target contains Zr and Ti with a ratio of 3:7.

TABLE VIII below summarizes the composition of the PZT targets used in the investigation.

TABLE VIII

| PZT target | Zr:Ti | Ca/(Zr + Ti) | Sr/(Zr + Ti) |
|---|---|---|---|
| QL | 3:7 | 0 | 0 |
| 1CS8 | 4:6 | 0.02 | 0.01 |
| 2CS5 | 4:6 | 0.035 | 0.025 |
| Zr/Ti | 3:7 | 0.05 | 0.025 |
| Std | 4:6 | 0.05 | 0.025 |

Referring to TABLE VII, the target 2CS5 corresponds to the target used in the experiment of TABLE II, the target 1CS8 corresponds to the target used in the experiment of TABLE III and the target QL corresponds to the target used in the experiment of TABLE IV. Further, the target Std corresponds to the target used in the experiment of TABLE I.

In the event the PZT film 34 is formed by using the conventional target Std of TABLE I, a large leakage current of $1\times10^{-2}$ A/cm² was observed when the upper electrode 35 of SrRuO₃ is formed on the PZT film 34. On the other hand, the leakage current is reduced to the level below $1\times10^{-5}$ A/cm² when the target Zr/Ti of TABLE VIII is used for depositing the PZT film 34.

The foregoing observation indicates that the Zr/Ti ratio in the PZT sputtering target also influences the leakage characteristic of the ferroelectric capacitor 30 that uses the SrRuO₃ upper electrode 35 in combination with the PZT capacitor insulation film 34 and that it is preferable to set the Zr/Ti ratio to be less than 2/3, preferably 3/7 or less.

Figure 6A:
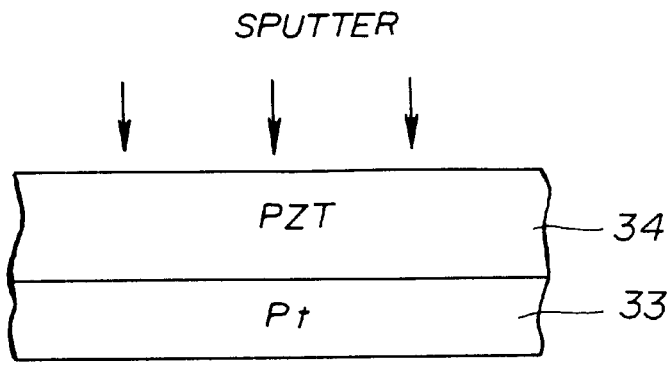
FIGS. 6A–6D are diagrams explaining a further aspect of the present invention.
Figure 6B:
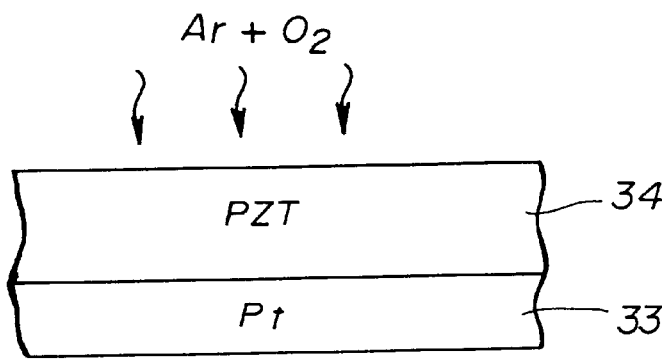
Figure 6C:
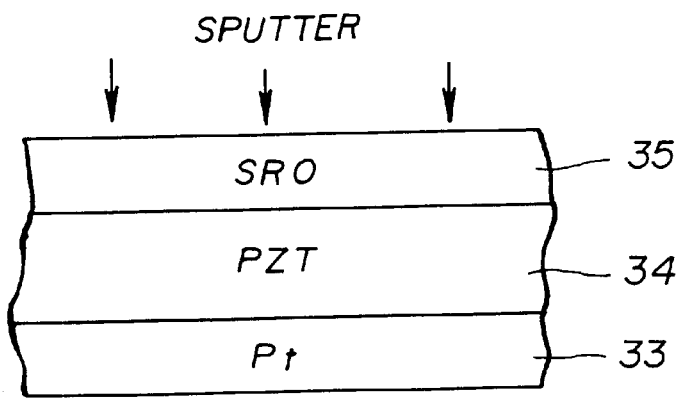
Figure 6D:
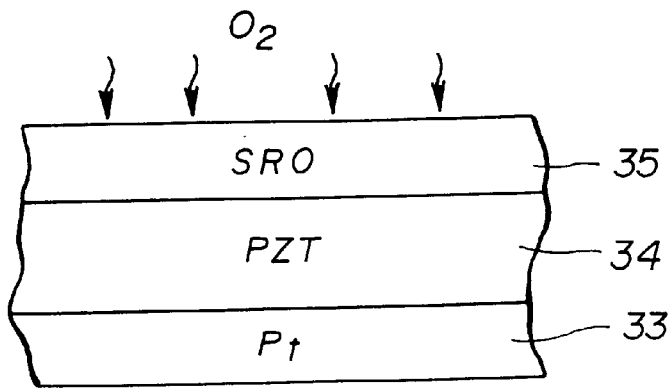

In another aspect, the present invention suppresses the leakage current through the PZT film 34 in the ferroelectric capacitor 30 of FIG. 2 that uses the upper electrode 35 of SrRuO₃ in combination with the PZT film 34, by forming the PZT film 34 by a sputtering process as represented in FIG. 6A, annealing the PZT film 34 in a mixed atmosphere of Ar and O₂ at a modest temperature of about 650° C. for provisional crystallization as represented in FIG. 6B, depositing the upper electrode 35 of SrRuO₃ on the PZT film 34 thus processed as represented in FIG. 6C by conducting a sputtering process, and applying a further annealing process in an O₂ atmosphere at a higher temperature of about 725° C. for full crystallization and densification as represented in FIG. 6D.

According to the present invention, the deposition of the upper electrode 35 of SrRuO₃ in the step of FIG. 6C is conducted before the PZT film 34 undergoes full crystallization and densification in the step of FIG. 6D. In other words, no substantial pinholes are formed in the PZT film 34 in the stage in which the upper electrode 35 is formed on the PZT film 34. The pinhole density in the state of FIG. 6C is believed to be less than about $17/\mu m^2$.

According to the process of FIGS. 6A–6D, it was confirmed that no increase of the leakage current was observed in the structure of FIG. 6D even when the PZT film 34 is subjected to the full crystallization process in the second annealing process conducted at a higher temperature and that the magnitude of the leakage current is suppressed to the order of $1\times10^{-5}$ A/cm² or less.

The structure of FIG. 6D is characterized by a flat and smooth top surface of the PZT film 34, in addition to the foregoing feature of reduced or substantially zero pinhole density. While there may be formed discrete voids in the PZT film 34 in the crystallization process of FIG. 6D as a result of the densification of the PZT film 34, these voids are not connected or aligned to provide the diffusion path of the Sr and Ru atoms and hence the current path of the leakage current. It is believed that existence of the SrRuO₃ upper electrode 35 effectively suppresses the formation of the pinholes and also the development of rough surface in the PZT film 34.

[First Embodiment]

Figure 7A:
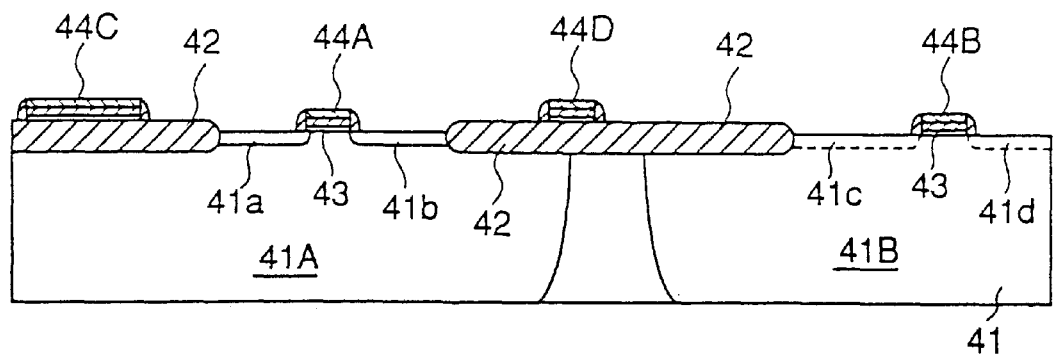
FIGS. 7A–7R are diagrams showing the fabrication process of a FeRAM according to first and second embodiments of the present invention.
Figure 7B:
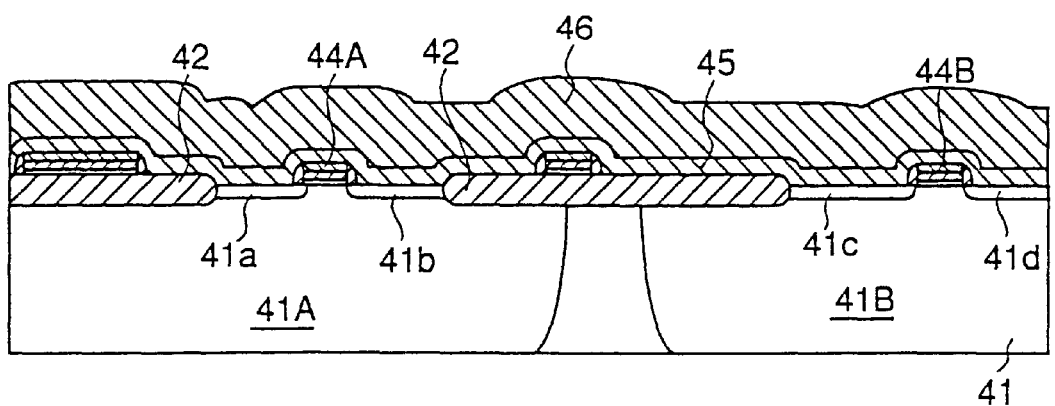
Figure 7C:
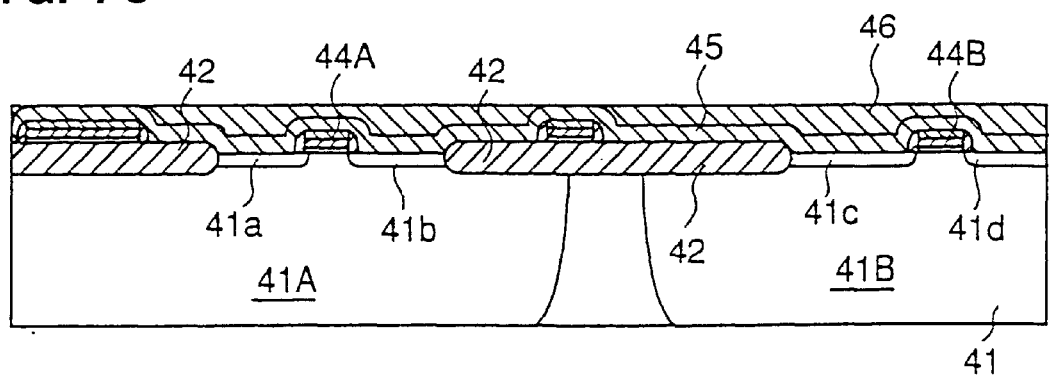
Figure 7D:
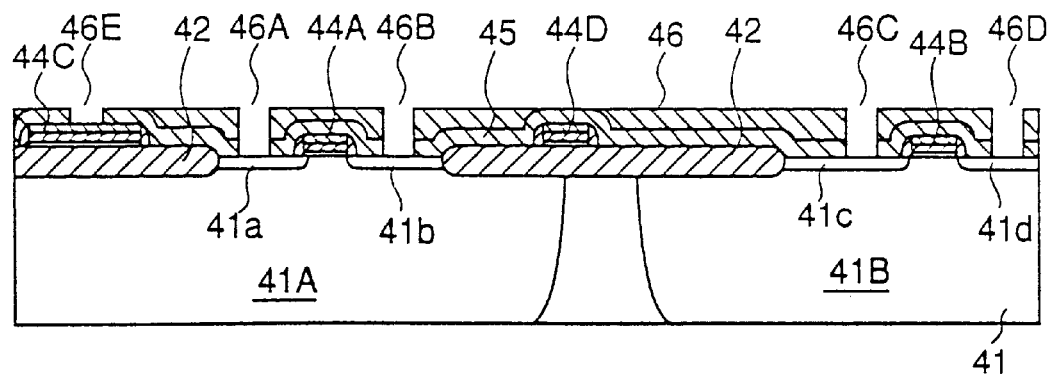
Figure 7E:
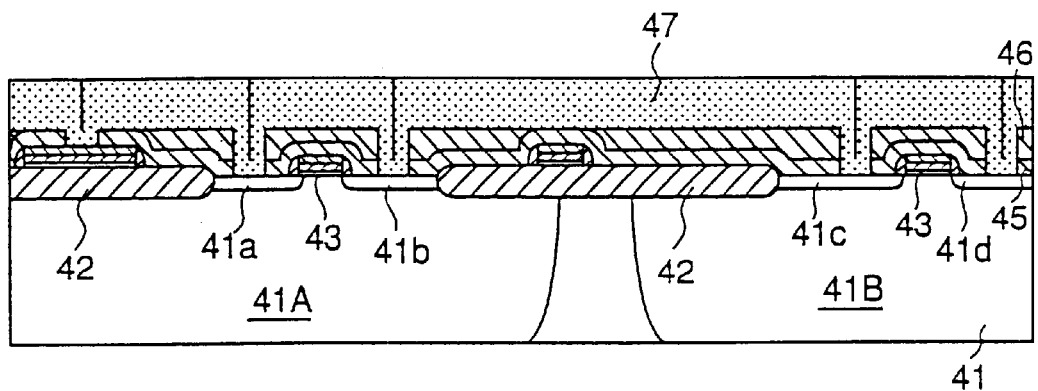
Figure 7F:
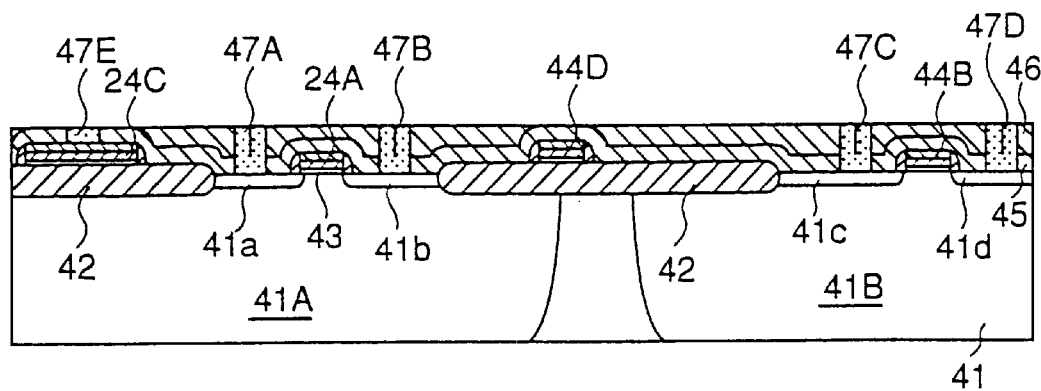
Figure 7G:
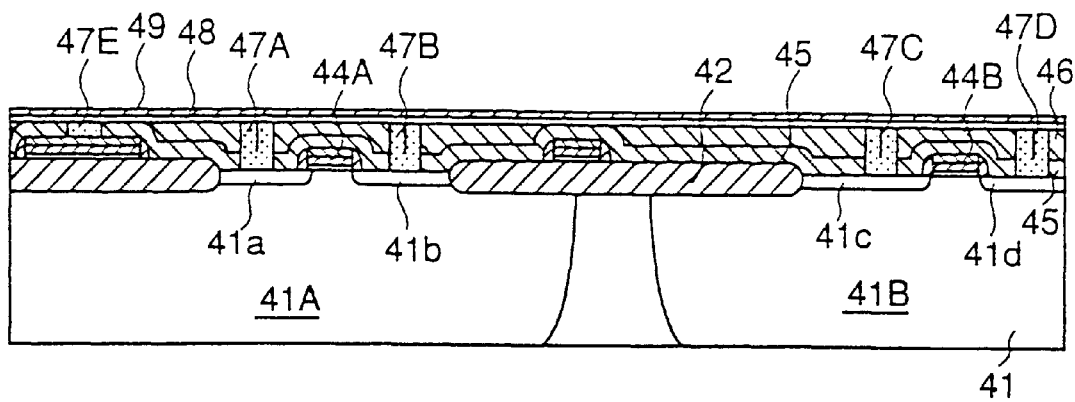
Figure 7H:
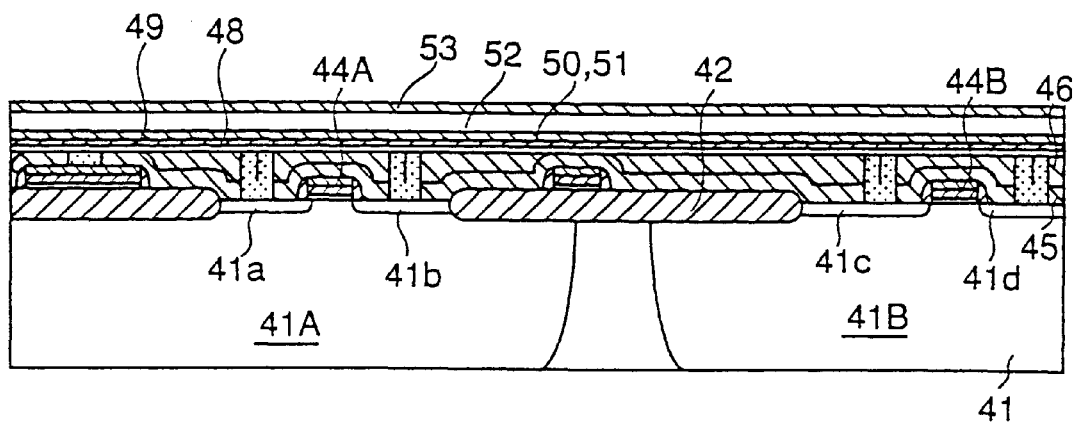
Figure 7I:
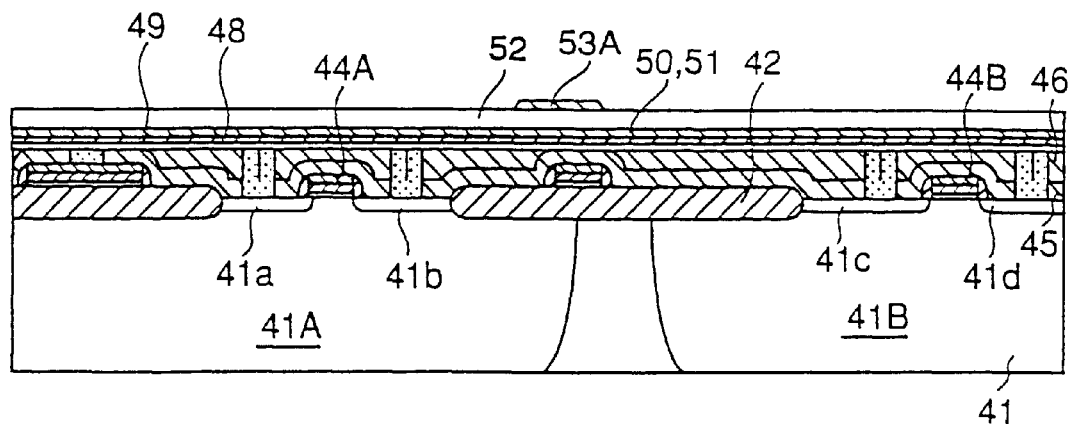
Figure 7J:
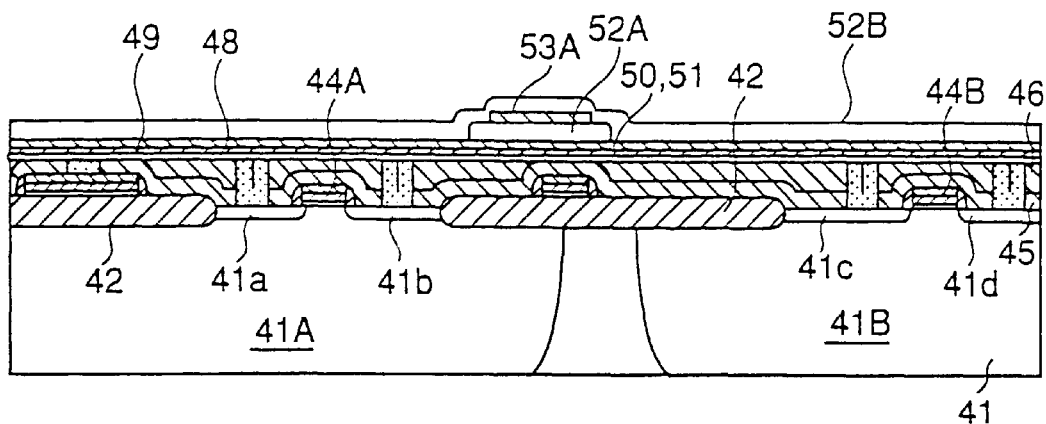
Figure 7K:
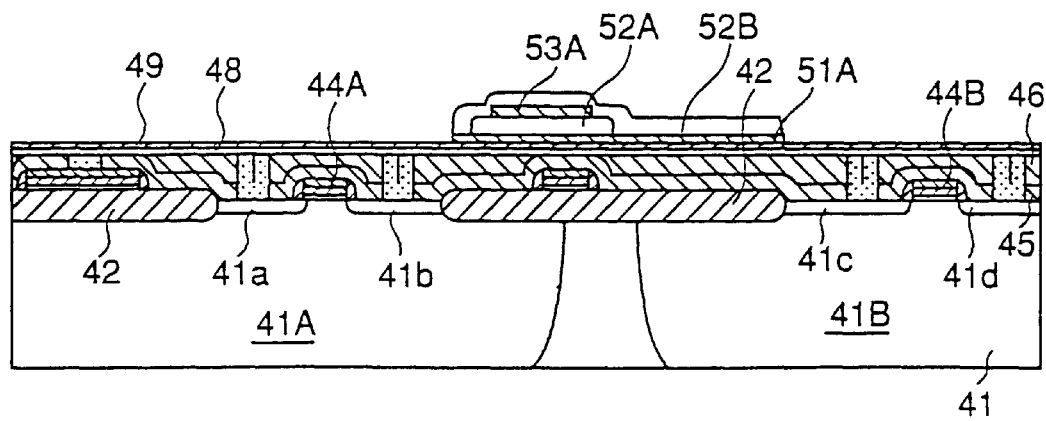
Figure 7L:
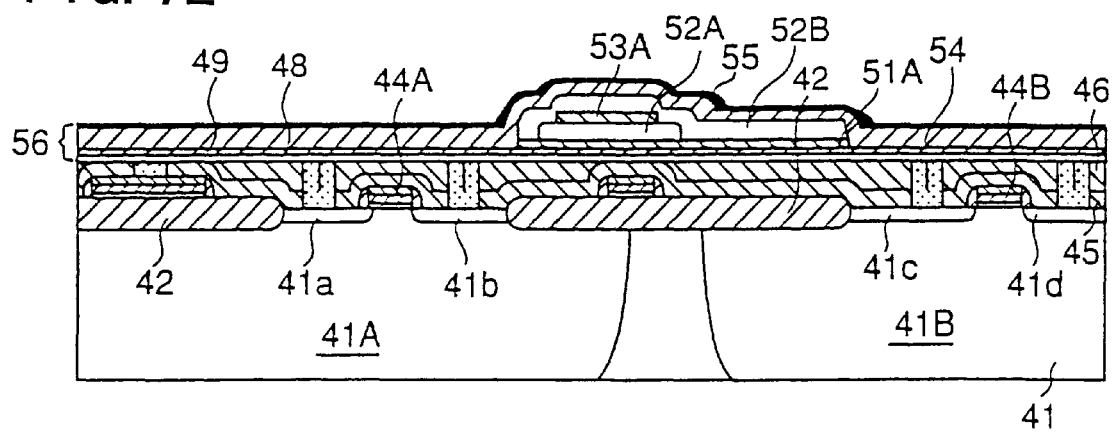
Figure 7M:
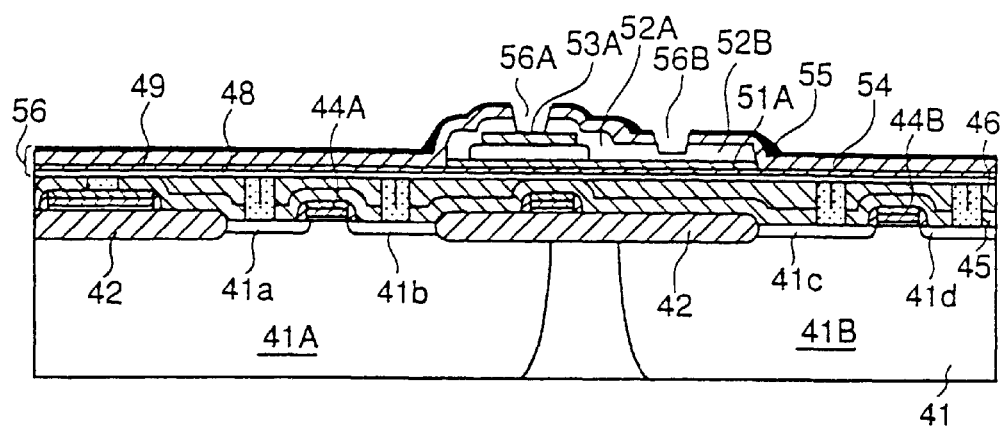
Figure 7N:
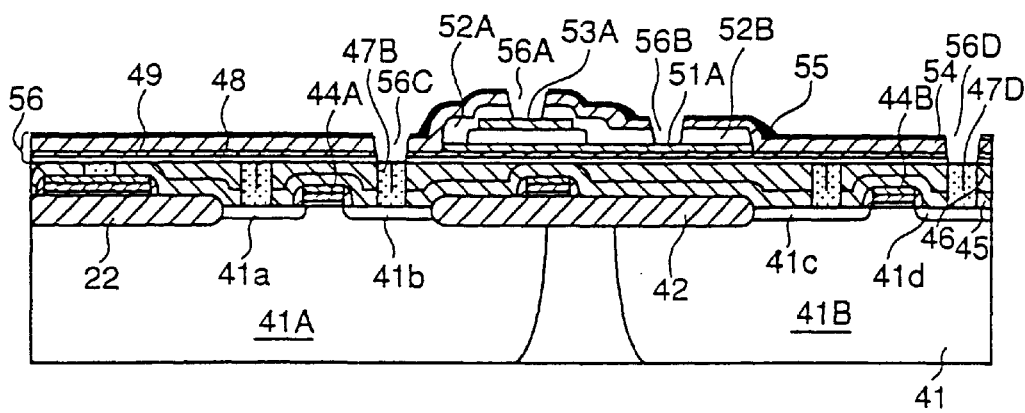
Figure 7O:
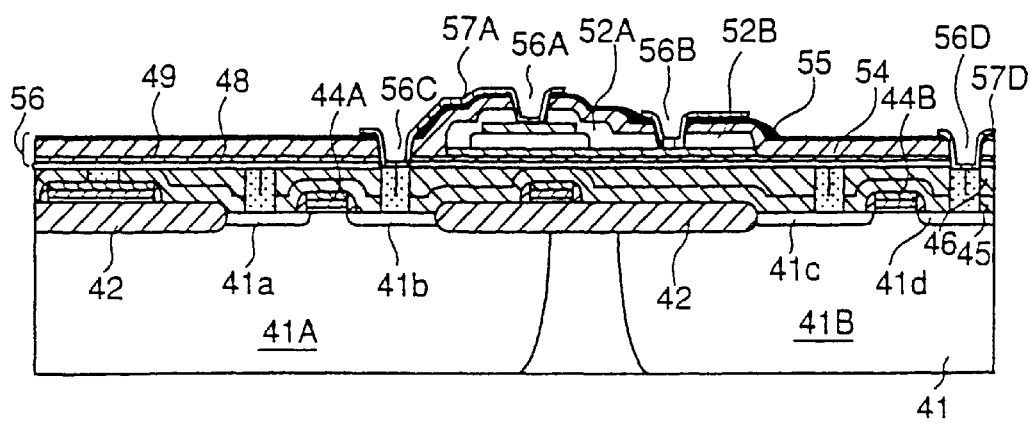
Figure 7P:
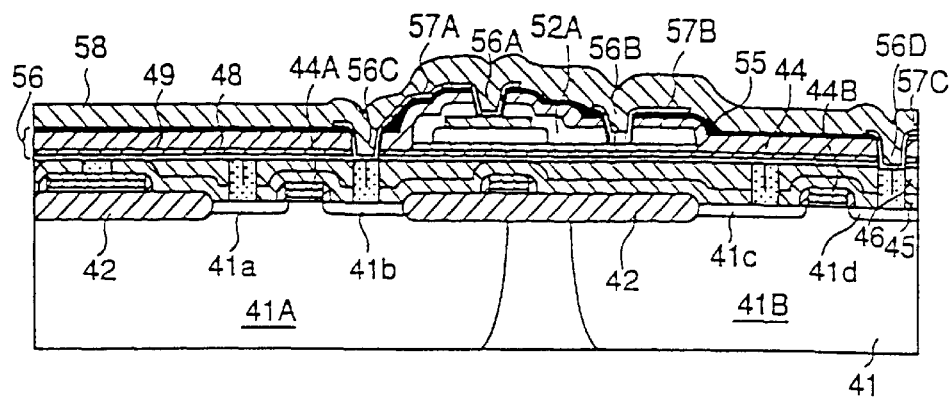
Figure 7Q:
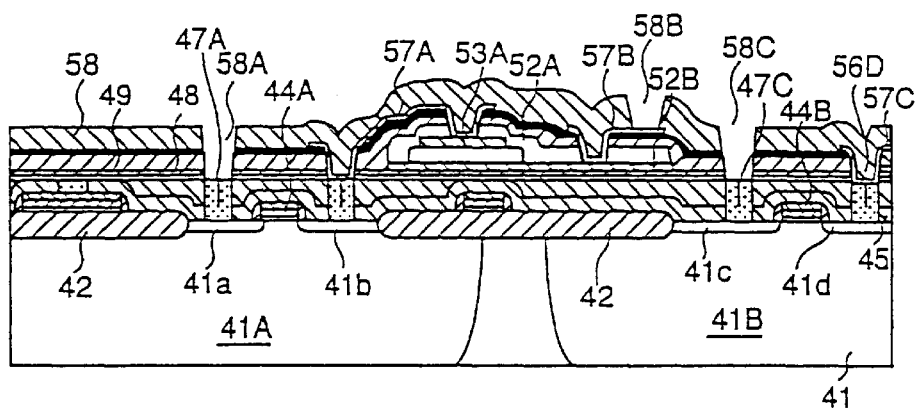
Figure 7R:
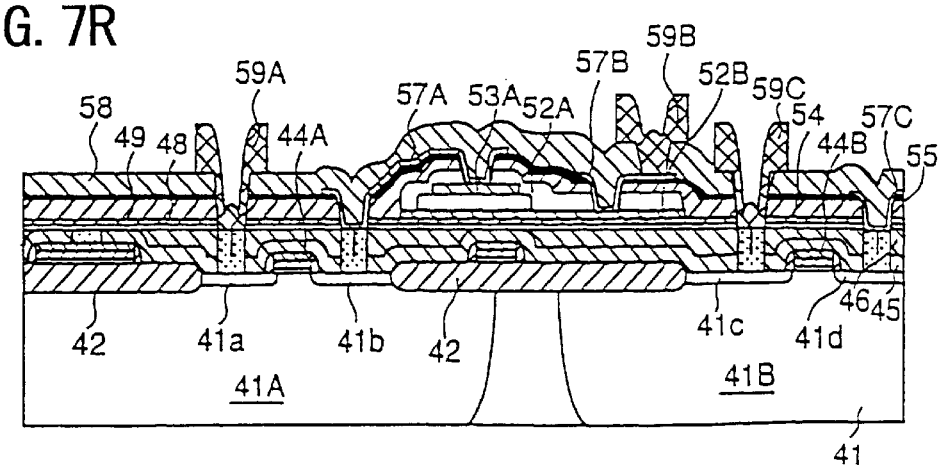

FIGS. 7A–7R show the fabrication process of a semiconductor device according to a first embodiment of the present invention.

Referring to FIG. 7A, a p-type well 41A and an n-type well 41B are formed on a Si substrate 41, which may be any of the p-type or n-type, wherein the Si substrate 41 is covered by a field oxide film 42 defining an active region in each of the p-type well 41A and the n-type well 41B.

Next, a gate oxide film 43 is formed on the active region of the p-type well 41A and also on the active region of the n-type well 41B, and a p-type polysilicon gate electrode 44A is formed on the gate oxide film 43 in the p-type well 41A. Similarly, an n-type polysilicon gate electrode 44B is formed on the gate oxide film 43 in correspondence to the n-type well 41B. In the illustrated example, polysilicon interconnection patterns 44C and 44D are formed further on the field oxide film 42 similarly to the polysilicon gate electrodes 44A and 44B.

In the structure of FIG. 7A, there are formed n-type diffusion regions 41a and 41b in the active region of the p-type well 41A by conducting an n-type impurity element by an ion implantation process, while using the gate electrode 44A and the side wall insulation films thereon as a self-alignment mask. Similarly, p-type diffusion regions 41c and 41d are formed in the active region of the n-type well 41B by an ion implantation process of a p-type impurity element, while using the gate electrode 44B and the side wall insulation films thereon as a self-alignment mask.

The process so far is nothing but an ordinary CMOS process.

Next, in the step of FIG. 7B, an SiON film 45 is deposited on the structure of FIG. 22A by a CVD process with a thickness of about 200 nm, and an $SiO_2$ film 46 is further deposited on the SiON film 45 by a CVD process with a thickness of about 1000 nm.

Further, in the step of FIG. 7C, the $SiO_2$ film 46 is subjected to a CMP process while using the SiON film 45 as a polishing stopper, and contact holes 46A–46D are formed in the step of FIG. 7D in the $SiO_2$ film 46 thus planarized such that the diffusion regions 41a, 41b, 41c and 41d are exposed by the contact holes 46A, 46B, 46C and 46D. In the illustrated example, the $SiO_2$ film 46 is further formed with a contact hole 46E so as to expose the interconnection pattern 44C.

Next, in the step of FIG. 7E, a W layer 47 is deposited on the structure of FIG. 7D so as to fill the contact holes 46A–46E, wherein the W layer 47 thus deposited is subjected to a CMP process while using the $SiO_2$ film 46 as a stopper. As a result of the polishing process, there are formed W plugs 47A–47E respectively in correspondence to the contact holes 46A–46E.

Next, in the step of FIG. 7G, an oxidization stopper film 48 of SiN and an $SiO_2$ film 49 are deposited consecutively on the structure of FIG. 7F respectively with the thicknesses of 100 nm and 130 nm, followed by a thermal annealing process conducted in an $N_2$ atmosphere.

Next, in the step of FIG. 7H, a Ti film 50 and a Pt film 51 are deposited consecutively on the $SiO_2$ film 49 with respective thicknesses of 20 nm and 175 nm by a sputtering process. The Ti film 50 and the Pt film 51 thereon constitute a lower electrode layer of the ferroelectric capacitor to be formed.

After the deposition of the Ti film 50 and the Pt film 51, a ferroelectric film 52 of PZT or PLZT is sputter-deposited in the step of FIG. 7H while using the sputtering target that contains Ca or Sr with the concentration levels, normalized to the sum of the Zr atoms and Ti atoms, of less than 0.035 and 0.025, more preferably about 0.02 or less and 0.01 or less, respectively. Alternatively, a sputtering target of PZT or PLZT containing Zr and Ti atoms with a ratio Zr/Ti of about 3/7 or less may be used in the step of FIG. 7H.

Further, in the step of FIG. 7H, the ferroelectric film 52 is subjected to a crystallization process first by a thermal annealing process conducted in an mixed atmosphere of O2 and Ar at 600° C., followed by an thermal annealing process conducted in an oxidizing atmosphere at 725° C.

Further, in the step of FIG. 7H, a $SrRuO_3$ film 53 is deposited on the ferroelectric film 52 thus processed as an upper electrode layer by a sputtering process with a thickness of about 50 nm.

Next, in the step of FIG. 7I, a resist pattern is formed on the upper electrode layer 53, followed by a patterning process of the upper electrode layer 53 by conducting a dry etching process to form an upper electrode pattern 53A of $SrRuO_3$ on the ferroelectric film 52. In the step of FIG. 7I, it should further be noted that the ferroelectric film 52 is subjected, after the foregoing sputtering and patterning of the upper electrode pattern 53A, to a recovery annealing process conducted in an $O_2$ atmosphere so as to recover any damages caused in the ferroelectric film 52 as a result of the foregoing sputtering and patterning processes. As a result of such a recovery annealing process, the $SrRuO_3$ upper electrode pattern 53A also undergoes crystallization.

Next, in the step of FIG. 7J, a resist pattern having a shape corresponding to the shape of the capacitor insulation film to be formed, is formed on the ferroelectric insulation film 52, and the ferroelectric insulation film 52 is subjected to a dry etching process while using the foregoing resist pattern as a mask. As a result, a desired capacitor insulation film pattern 52A is formed on the underlying lower electrode layer 51. Further, an encapsulating layer 52B is formed on the lower electrode layer 51 by a ferroelectric material having a composition substantially identical with that of the material constituting the ferroelectric film 52, by conducting a sputtering process with a thickness of about 20 nm. The encapsulating layer 52B thus deposited is then annealed by an RTA process in the $O_2$ atmosphere. The encapsulating layer 52B thereby protects the ferroelectric capacitor insulation film pattern 52A from reduction.

Next, in the step of FIG. 7K, a resist pattern is formed on the lower electrode layer 51 so as to cover the encapsulating layer 52B with a pattern corresponding to the lower electrode pattern to be formed. Further, by conducting a dry etching process on the foregoing encapsulating layer 52B and the underlying Pt and Ti films 50 and 51 underneath the encapsulating layer 52B by a dry etching process, a lower electrode pattern 51A is formed.

After the formation of the lower electrode pattern 51A, the resist pattern is removed in the step of FIG. 7K, and the damages that are introduced into the ferroelectric capacitor insulation film 52A during the dry etching process of the lower electrode pattern 51A are recovered by conducting a recovery annealing process in an $O_2$ atmosphere.

Next, in the step of FIG. 7L, an $SiO_2$ film 54 is deposited on the structure of FIG. 7K by a CVD process, typically with a thickness of about 200 nm, followed by a formation of an SOG film 55 thereon, wherein the SOG film 55 smoothes any sharp steps formed on the underlying $SiO_2$ film 54. The $SiO_2$ film 54 and the SOG film 55 form together an interlayer insulation film 56.

Next, in the step of FIG. 7M, contact holes 56A and 56B are formed in the interlayer insulation film 56 so as to expose the upper electrode pattern 53A and the lower electrode pattern 51A respectively, and contact holes 56C and 56D are formed further in the step of FIG. 7N in the interlayer insulation film 56 so as to expose the W plugs 47B and 47D respectively through the underlying $SiO_2$ film 49 and the SiN film 48. Further, in the step of FIG. 7M, a recovery annealing process is conducted, after the dry etching process for forming the contact holes 56A and 56B, in an $O_2$ atmosphere. As a result of the recovery annealing process, any damages introduced into the ferroelectric film patterns 52A and 52B during the dry etching process are eliminated.

Next, in the step of FIG. 7O, a local interconnection pattern 57A is formed by a TiN film such that the local interconnection pattern 57A connects the contact hole 56A and the contact hole 56C electrically. Further, a similar local interconnection pattern 57B and 57C are formed on the contact holes 56B and 56C.

Next, in the step of FIG. 7P, an $SiO_2$ film 58 is formed on the structure of FIG. 7O, and contact holes 58A, 58B and 58C are formed in the $SiO_2$ film in the step of FIG. 7Q so as to expose the W plug 47A, the local interconnection pattern 57B and the W plug 47C, respectively.

Further, in the step of FIG. 7R, electrodes 59A, 59B and 59C are formed respectively in correspondence to the contact holes 58A, 58B and 58C.

Further, the process of forming the interlayer insulation film and the interconnection patterns may be repeated as desired, to form a multilayer interconnection structure.

According to the present embodiment, the leakage current through the ferroelectric capacitor insulation film pattern 52A is successfully minimized, by minimizing the pinholes in the ferroelectric film 52 to the level of about $17/\mu m^2$ or less by way of the use of a PZT sputter target that contains a reduced amount of Ca and Sr.

[Second Embodiment]

Next, a second embodiment of the present invention will be described with reference to FIGS. 7A–7R.

In the present embodiment, the process proceeds similarly to the previous embodiment starting from the step of FIG. 7A up to the step of FIG. 7H, and the ferroelectric film 52 of PZT or PLZT is deposited on the lower electrode layer 51 by a sputtering process similarly to the previous embodiment.

In the present embodiment, the ferroelectric film 52 thus deposited is subjected to a thermal annealing process corresponding to the first RTA process in the mixed atmosphere of Ar and $O_2$ for provisional crystallization, and the upper electrode layer 53 of $SrRuO_3$ is deposited on the ferroelectric film 52 immediately after the foregoing first RTA process.

After the deposition of the upper electrode layer 53, the ferroelectric film 52 is subjected to a second thermal annealing process corresponding to the second RTA process in the $O_2$ atmosphere for full crystallization and densification.

After the step of FIG. 7H, the steps of FIGS. 7I–7R are conducted consecutively, similarly to the previous embodiment.

In the present embodiment, too, it is possible to minimize the leakage current flowing through the ferroelectric capacitor insulation pattern 52A of sputtered PZT carrying thereon the upper electrode 53A of $SrRuO_3$.

Further, the present invention is not limited to the embodiments described heretofore, but various variations and modifications may be made without departing from the scope of the present invention.

What is claimed is:

1. A ferroelectric random access memory, comprising:

a substrate carrying thereon an active device;

a lower electrode provided over said substrate in electrical connection with said active layer;

a ferroelectric film containing at least Pb, Zr and Ti and having a perovskite structure, said ferroelectric film comprising a number of crystal grains extending continuously from a bottom surface to a top surface of said ferroelectric film and forming a columnar microstructure, said crystal grains having pinholes; and an upper electrode of a conductive oxide film provided on said ferroelectric film, said upper electrode having a perovskite structure and containing therein Sr and Ru, said ferroelectric film further containing Ca and Sr, said ferroelectric film including said pinholes with a density not exceeding 34 pinholes/$\mu m^2$.

2. A ferroelectric random access memory as claimed in claim 1, wherein said pinholes have a size of several ten nanometers.

3. A ferroelectric random access memory as claimed in claim 1, wherein said ferroelectric film includes said pinholes with a density of about 17 pinholes/$\mu m^2$ or less.

4. A ferroelectric random access memory as claimed in claim 1, wherein said ferroelectric film includes said pinholes with a density of about 1 pinholes/$\mu m^2$ or less.

5. A ferroelectric random access memory as claimed in claim 1, wherein each of said pinholes extend generally perpendicularly to a principal surface of said ferroelectric film.

6. A ferroelectric random access memory as claimed in claim 1, wherein said ferroelectric film has projections and depressions corresponding to crystal grains in said ferroelectric film.

* * * * *